US012324199B2

(12) United States Patent
Lin et al.

(10) Patent No.: US 12,324,199 B2
(45) Date of Patent: Jun. 3, 2025

(54) FILL STRUCTURES WITH AIR GAPS

(71) Applicant: Taiwan Semiconductor Manufacturing Company, Ltd., Hsinchu (TW)

(72) Inventors: Hsiu-Yung Lin, New Taipei (TW); Yen Chuang, Taipei (TW); Min-Hao Hong, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/595,033

(22) Filed: Mar. 4, 2024

(65) Prior Publication Data

US 2024/0250121 A1    Jul. 25, 2024

Related U.S. Application Data

(62) Division of application No. 17/549,049, filed on Dec. 13, 2021, now Pat. No. 11,961,884.

(60) Provisional application No. 63/168,765, filed on Mar. 31, 2021.

(51) Int. Cl.
| | | |
|---|---|---|
| *H01L 29/94* | (2006.01) | |
| *H01L 21/02* | (2006.01) | |
| *H01L 29/76* | (2006.01) | |
| *H10D 30/62* | (2025.01) | |
| *H10D 62/10* | (2025.01) | |

(52) U.S. Cl.
CPC ..... *H10D 62/115* (2025.01); *H01L 21/02252* (2013.01); *H10D 30/6211* (2025.01)

(58) Field of Classification Search
CPC ............. H10D 62/115; H10D 30/6211; H10D 84/0158; H10D 84/038; H10D 84/834; H01L 21/02252; H01L 21/02211; H01L 21/02274; H01L 21/0228; H01L 21/764; H01L 21/02164
USPC ......................................................... 257/288
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

*Primary Examiner* — Theresa T Doan
(74) *Attorney, Agent, or Firm* — Sterne, Kessler, Goldstein & Fox P.L.L.C.

(57) ABSTRACT

The present disclosure describes a semiconductor device with a fill structure. The semiconductor structure includes first and second fin structures on a substrate, an isolation region on the substrate and between the first and second fin structures, a first gate structure disposed on the first fin structure and the isolation region, a second gate structure disposed on the second fin structure and the isolation region, and the fill structure on the isolation region and between the first and second gate structures. The fill structure includes a dielectric structure between the first and second gate structures and an air gap enclosed by the dielectric structure. The air gap is below top surfaces of the first and second fin structures.

20 Claims, 20 Drawing Sheets

(56) References Cited

U.S. PATENT DOCUMENTS

2017/0229452 A1    8/2017   Chang et al.
2022/0320273 A1   10/2022   Lin et al.

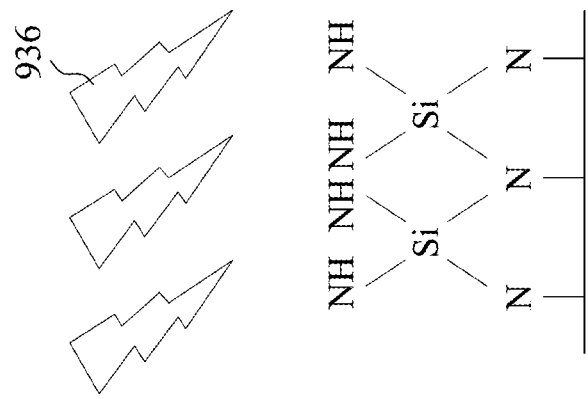
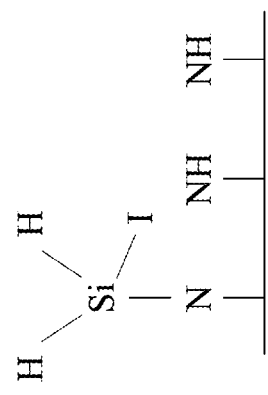
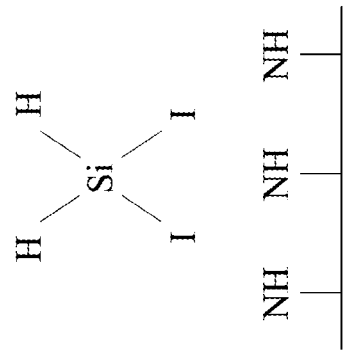
FIG. 9A
FIG. 9B
FIG. 9C

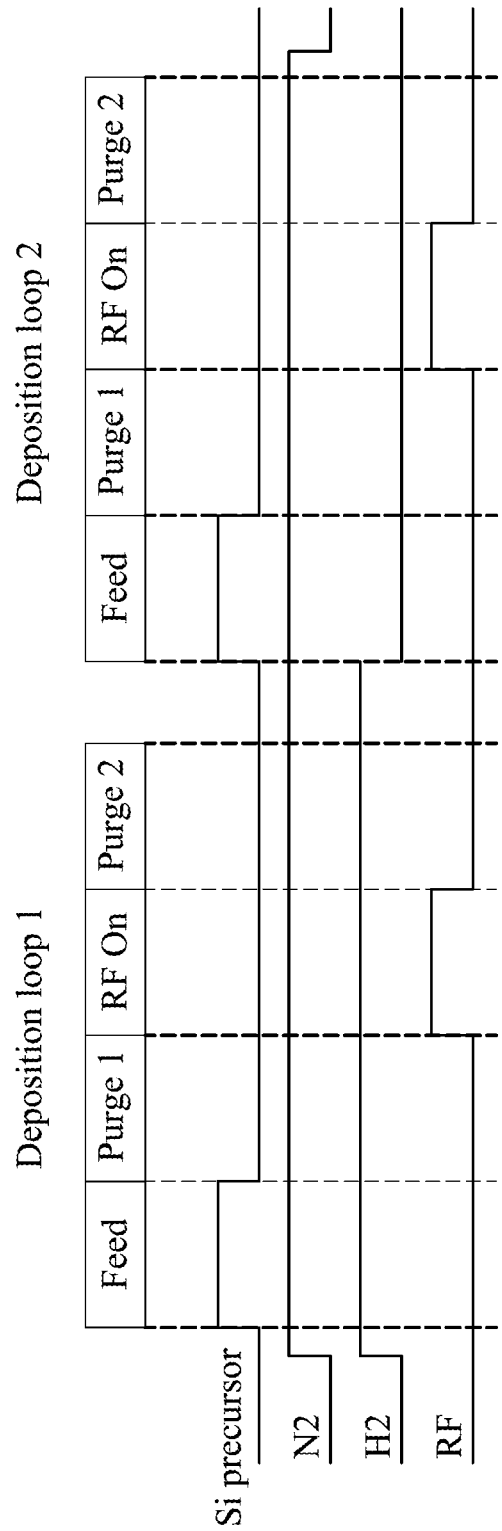

US 12,324,199 B2

FILL STRUCTURES WITH AIR GAPS

CROSS-REFERENCE TO RELATED APPLICATIONS

This application is a divisional application of U.S. patent Application No. 17/549,049, titled "Fill Structures with Air Gaps," filed on Dec. 13, 2021, which claims the benefit of U.S. Provisional Patent Application No. 63/168,765, titled "CMG Refill Structure Optimization for K value," filed Mar. 31, 2021, the disclosures of which are incorporated by reference herein in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

FIGS. 9A-11B illustrate process operations during fabrication of a semiconductor device with a fill structure, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
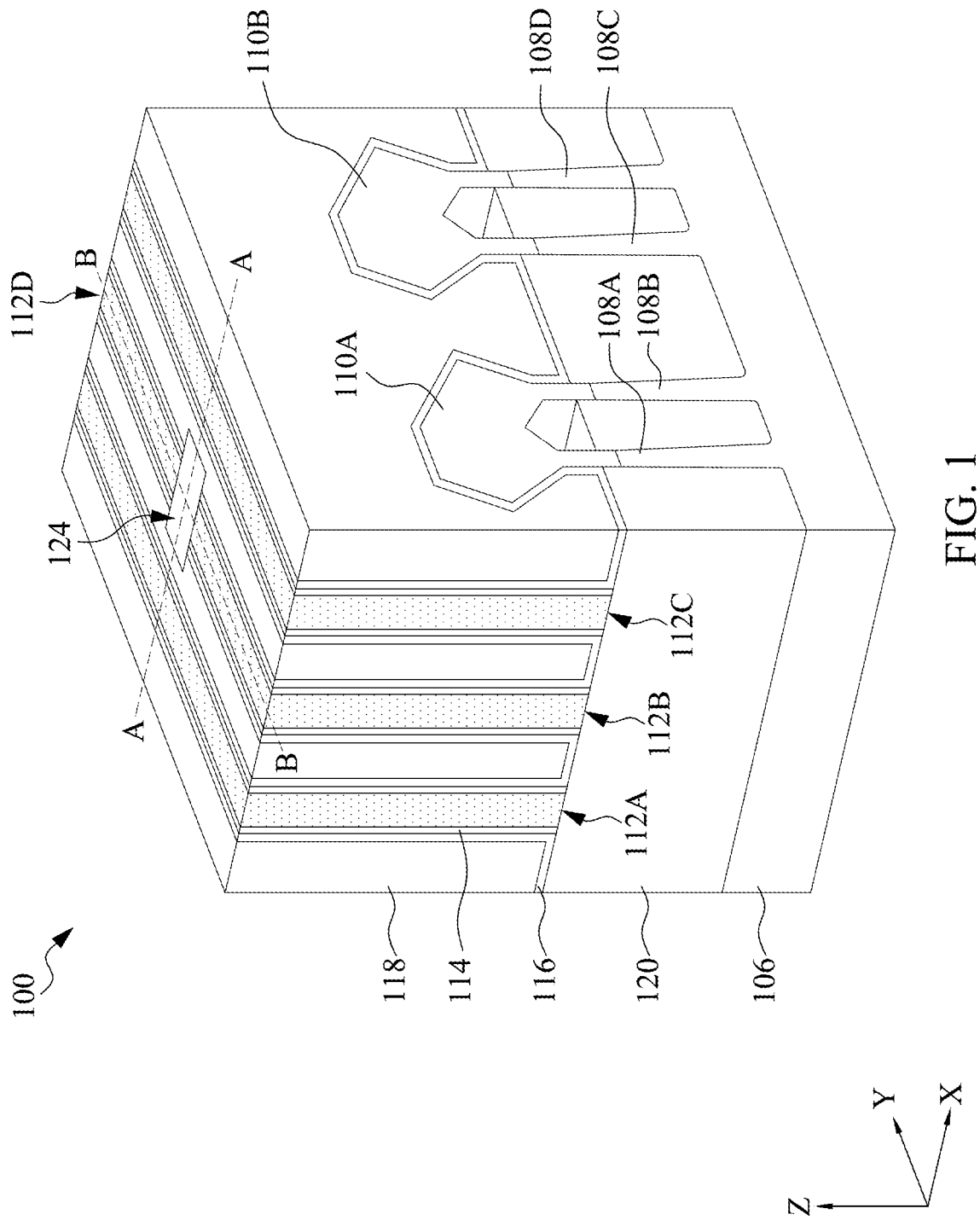
FIG. 1 illustrates an isometric view of a semiconductor device with a fill structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Gate structures in semiconductor devices with finFETs can extend over two or more of the finFETs. For example, the gate structures can be formed as gate structures extending across the active regions (e.g., fin regions) of the finFETs. Once the gate structures are formed, a patterning process can "cut" one or more of the gate structures into shorter sections according to the desired structure. In other words, the patterning process can remove redundant gate portions of the one or more gate structures to form one or more isolation trenches (also referred to as "metal cuts") between the finFETs and separate the gate structures into shorter sections. This process is referred to as a cut-metal-gate (CMG) process. Subsequently, the isolation trenches formed between the separated sections of the gate structures can be filled with a dielectric material, such as silicon nitride (SiN) to form fill structures, which can electrically isolate the separated gate structure sections.

The fill structures with the gate structure sections can have undesirable parasitic capacitances. The parasitic capacitances are exacerbated by the fill structures' dielectric constant due to the dielectric constant of the SiN (e.g., about 6.5 to about 8) in the fill structures. The parasitic capacitances can adversely impact device performance, such as by increasing RC time delay in the semiconductor devices.

Various embodiments in the present disclosure provide example fill structures having air gaps for reducing parasitic capacitance in a semiconductor device and example methods for fabricating the same. In some embodiments, the fill structure can include an air gap, which has a dielectric constant of about 1, in a lower portion of the fill structure to reduce the dielectric constant of the fill structure. In some embodiments, the fill structure can be formed on shallow trench isolation (STI) regions of the semiconductor device. The air gap can be above the STI regions and below top surfaces of the fin structures of the semiconductor device. In some embodiments, the fill structure can extend into the STI regions and the air gap can be formed below a top surface of the STI regions. The fill structure can be formed by depositing a SiN-based dielectric material at a first deposition rate to form the air gap at the lower portion of the fill structure, followed by depositing the SiN-based dielectric material at a second deposition rate higher than the first deposition to seal the air gap and fill the isolation trench. In some embodiments, the fill structure can have a seam above the air gap and below top surfaces of the gate structures. A width of the seam can be less than a width of the air gap and can range from about 0.1 nm to about 5 nm. The air gap in the fill structure can reduce the dielectric constant of the fill structure by about 20% to about 50% compared to fill structures with only SiN-based dielectric materials. In addition, the configurations of the air gap and the seam can prevent an etch back of the fill structure and prevent damage of the fill structure in subsequent processes.

Figure 2:
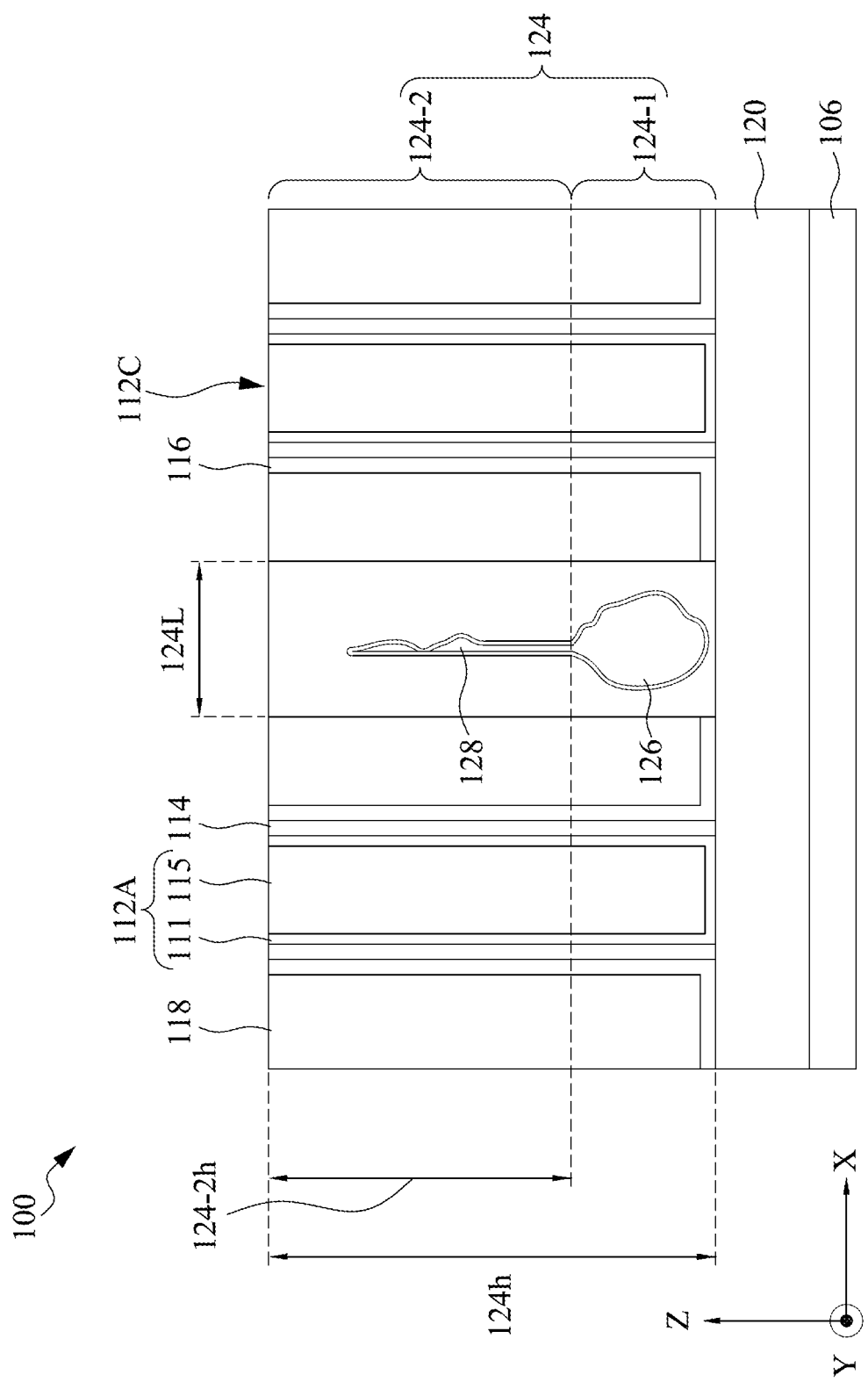
FIGS. 2 and 3A-3D illustrate various cross-sectional views of a semiconductor device with a fill structure, in accordance with some embodiments.

FIG. 1 illustrates an isometric view of a semiconductor device 100 with a fill structure 124, in accordance with some embodiments. FIG. 2 illustrates a cross-sectional view of semiconductor device 100 with a fill structure 124 along line A-A in FIG. 1, in accordance with some embodiments. FIGS. 3A-3D illustrate cross-sectional views of semiconductor device 100 with a fill structure 124 along line B-B in FIG. 1, in accordance with some embodiments. FIGS. 3A-3D can illustrate various configurations of fill structure 124, in accordance with some embodiments.

Referring to FIGS. 1, 2, and 3A-3D, semiconductor device 100 can be formed on a substrate 106 and can include fin structures 108A-108D extending along an X-axis, shallow trench isolation (STI) regions 120, source/drain (S/D) epitaxial structures 110A-110B, gate structures 112A-112D extending along a Y-axis, gate spacers 114, etch stop layer (ESL) 116, interlayer dielectric (ILD) layer 118, and fill structure 124. In addition, semiconductor device 100 can be incorporated into an integrated circuit (IC) through the use of other structural components, such as contact structures, conductive vias, conductive lines, dielectric layers, passivation layers, and interconnects, which are not shown for simplicity. The discussion of elements of semiconductor device 100 with the same annotations applies to each other, unless mentioned otherwise. And like reference numerals generally indicate identical, functionally similar, and/or structurally similar elements.

Substrate 106 can include a semiconductor material, such as silicon (Si). In some embodiments, substrate 106 includes a crystalline Si substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

STI regions 120 can provide electrical isolation between fin structures 108A-108D from each other and from neighboring fin structures (not shown) on substrate 106 and/or neighboring active and passive elements (not shown) integrated with or deposited on substrate 106. STI regions 120 can be made of a dielectric material. In some embodiments, STI regions 120 can include silicon oxide, SiN, silicon oxynitride, fluorine-doped silicate glass (FSG), a low-k dielectric material, and/or other suitable insulating materials. In some embodiments, STI regions 120 can include a multi-layered structure.

Fin structures 108A-108D (collectively referred to as "fin structures 108") can be formed from patterned portions of substrate 106. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers can be formed alongside the patterned sacrificial layer using a self-aligned process. The sacrificial layer is then removed, and the remaining spacers can then be used to pattern the fin structures.

Fin structures 108 can extend along an X-axis through gate structures 112A-112D. Portions of fin structures 108 under S/D epitaxial structures 110A-110B can be recessed within STI regions 120 compared to portions of fin structures 108 under gate structures 112A-112D. Fin structures 108 can include a material similar to substrate 106 and can be formed from patterning and etching substrate 106. In some embodiments, fin structures 108 can include a semiconductor material different from substrate 106 and can be formed from patterning and etching an epitaxial layer grown on substrate 106. In some embodiments, fin structures 108 can have a semiconductor material with a crystalline microstructure—e.g., a non-amorphous or non-polycrystalline microstructure. In some embodiments, fin structures 108 can have a height $108h$ above STI regions 120 along a Z-axis ranging from about 40 nm to about 60 nm. Referring to FIGS. 1 and 3A-3D, fin structures 108 under gate structures 112A-112D can form channel regions of semiconductor device 100 and represent current carrying structures of semiconductor device 100. Though four fin structures 108 are shown in FIGS. 1 and 3A-3D, semiconductor device 100 can have any number of fin structures 108.

S/D epitaxial structures 110A-110B (collectively referred to as "S/D epitaxial structures 110") can be disposed on fin structures 108 that are not covered by gate structures 112A-112D. S/D epitaxial structures 110 can function as S/D regions of semiconductor device 100. In some embodiments, S/D epitaxial structures 110 can have any geometric shape, such as a polygon, an ellipsis, and a circle. In some embodiments, S/D epitaxial structures 110 can include an epitaxially-grown semiconductor material the same as the material of substrate 106. In some embodiments, the epitaxially-grown semiconductor material can include a material different from the material of substrate 106 and imparts a strain on the channel regions under gate structures 112A-112D. Since the lattice constant of such epitaxially-grown semiconductor material is different from the material of substrate 106, the channel regions are strained to advantageously increase carrier mobility in the channel regions of semiconductor device 100. The epitaxially-grown semiconductor material can include: (i) a semiconductor material, such as germanium and Si; (ii) a compound semiconductor material, such as gallium arsenide and aluminum gallium arsenide; or (iii) a semiconductor alloy, such as silicon germanium and gallium arsenide phosphide.

In some embodiments, S/D epitaxial structures 110 can include Si and can be in-situ doped during an epitaxial growth process using n-type dopants, such as phosphorus and arsenic. In some embodiments, S/D epitaxial structures 110 can include Si, silicon germanium, germanium, or III-V materials (e.g., indium antimonide, gallium antimonide, or indium gallium antimonide) and can be in-situ doped during an epitaxial growth process using p-type dopants (e.g., boron, indium, and gallium). In some embodiments, S/D epitaxial structures 110 can include one or more epitaxial layers and each epitaxial layer can have different dopant concentration and/or different material compositions.

Figure 3A:
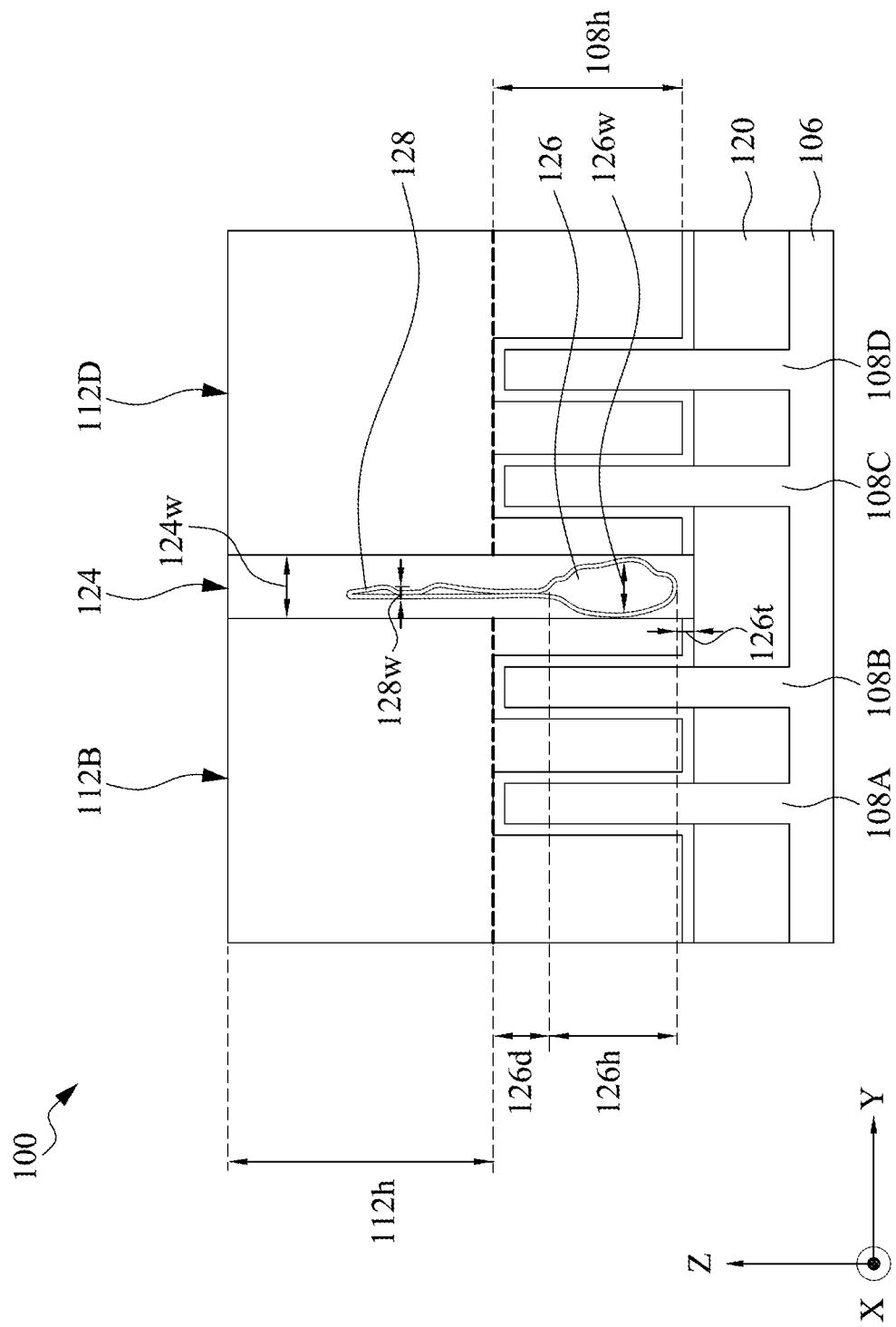

Referring to FIGS. 1, 2, and 3A-3D, gate structures 112A-112D are disposed on fin structures 108 and STI regions 120. In some embodiments, gate structures 112A-112D can include multiple layers. Each of gate structures 112A-112D can include a gate dielectric layer 111 and a metal fill 115. In some embodiments, gate dielectric layer 111 can include an interfacial layer and a high-k gate dielectric layer on the interfacial layer. The term "high-k" can refer to a high dielectric constant. In the field of semiconductor device structures and manufacturing processes, high-k can refer to a dielectric constant that is greater than the dielectric constant of silicon oxide (e.g., greater than about 3.9). The interfacial layer can include silicon oxide, silicon germanium oxide, or germanium oxide. The high-k gate dielectric layer can include hafnium oxide, zirconium oxide, and other suitable high-k dielectric materials. In some embodiments, metal fill 115 can include a work function layer on the high-k gate dielectric layer and a gate electrode on the work function layer. The work function layer can include work function metals, such as titanium nitride, ruthenium, titanium aluminum, titanium aluminum carbon, tantalum aluminum, tantalum aluminum carbon, and other suitable work function metals. The work function layer can include a single metal layer or a stack of metal layers. The gate electrode can include titanium, tantalum, aluminum, cobalt, tungsten, nickel, ruthenium, and other suitable conductive materials. In some embodiments, gate structures 112A-112D can have a height 112$h$ above the top surfaces of fin structures 108 ranging from about 40 nm to about 60 nm, as shown in FIG. 3A.

Gate spacers 114 can be disposed on sidewalls of gate structures 112A-112D between S/D epitaxial structures 110 and gate structures 112A-112D. Gate spacers 114 can include insulating materials, such as silicon oxide, SiN, silicon oxynitride, silicon carbonitride, silicon oxycarbide, silicon oxycarbonitride, a low-k material, and a combination thereof. Gate spacers 114 can include a single layer or a stack of insulating layers. Gate spacers 114 can have a low-k material with a dielectric constant less than about 3.9.

ESL 116 can be disposed on STI regions 120, S/D epitaxial structures 110, and sidewalls of gate spacers 114. ESL 116 can be arranged to protect STI regions 120, S/D epitaxial structures 110, and gate structures 112A-112D during the formation of S/D contact structures on S/D epitaxial structures 110. In some embodiments, ESL 116 can include, for example, silicon oxide, SiN, silicon oxynitride, silicon carbide, silicon carbonitride, boron nitride, silicon boron nitride, silicon carbon boron nitride, or a combination thereof.

ILD layer 118 can be disposed on ESL 116 over S/D epitaxial structures 110 and STI regions 120. ILD layer 118 can include a dielectric material deposited using a deposition method suitable for flowable dielectric materials. For example, flowable silicon oxide can be deposited using flowable chemical vapor deposition (FCVD). In some embodiments, the dielectric material can include silicon oxide. As shown in FIGS. 1 and 2, ILD layer 118 can surround gate structures 112A-112D and fill structure 124.

Referring to FIGS. 1, 2, and 3A-3D, fill structure 124 can be disposed between gate structures 112B and 112D to electrically isolated gate structures 112B and 112D from each other to provide independently-controlled gate structures. Though one fill structure is shown in semiconductor device 100, semiconductor device 100 can have any number of fill structures. In some embodiments, as shown in FIGS. 2 and 3A, fill structure 124 can include a lower portion 124-1 having an air gap 126 and an upper portion 124-2 having a seam 128. In some embodiments, fill structure 124 can have a vertical dimension 124$h$ (e.g., height) along a Z-axis ranging from about 100 nm to about 160 nm. In some embodiments, upper portion 124-2 can have a vertical dimension 124-2$h$ (e.g., height) along a Z-axis ranging from about 75 nm to 100 nm to protect air gap 126. In some embodiments, as shown in FIG. 2, fill structure 124 can have a horizontal dimension 124L (e.g., length) along an X-axis ranging from about 20 nm to about 40 nm. Horizontal dimension 124L can be greater than about 40 nm when more than one gate structure is cut by one fill structure. In some embodiments, as shown in FIG. 3A, fill structure 124 can have a horizontal dimension 124$w$ (e.g., width) along a Y-axis ranging from about 10 nm to about 20 nm.

Figure 3B:
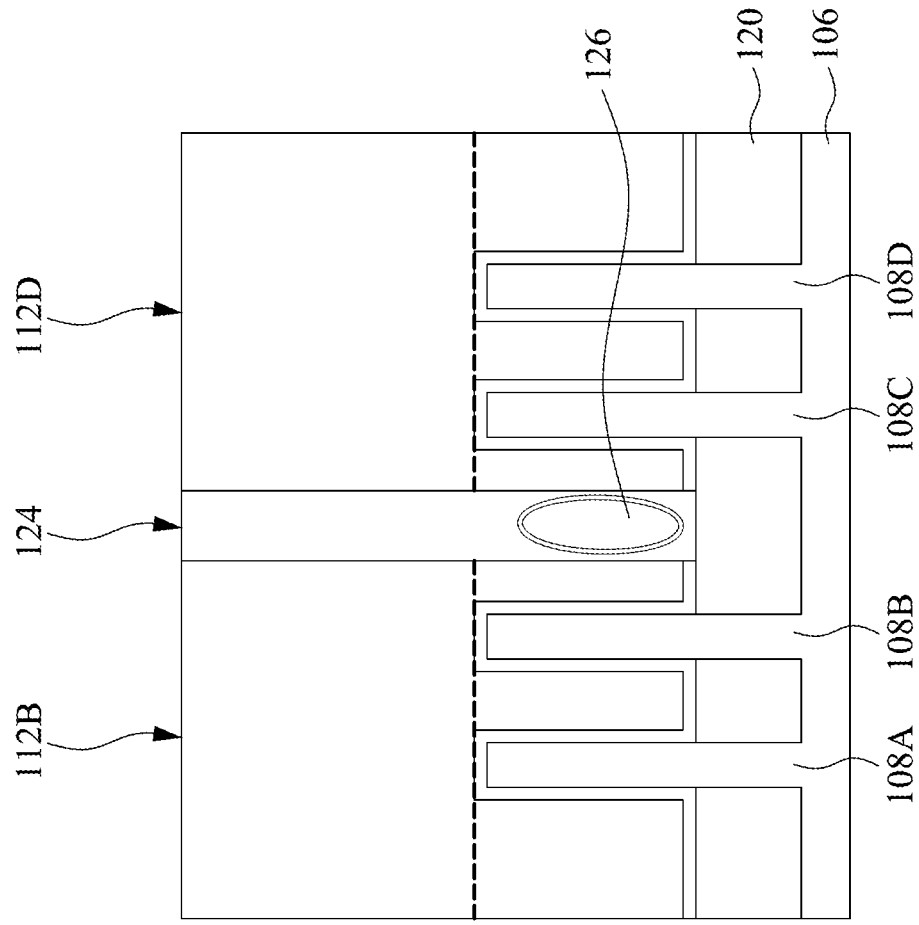
Figure 3C:
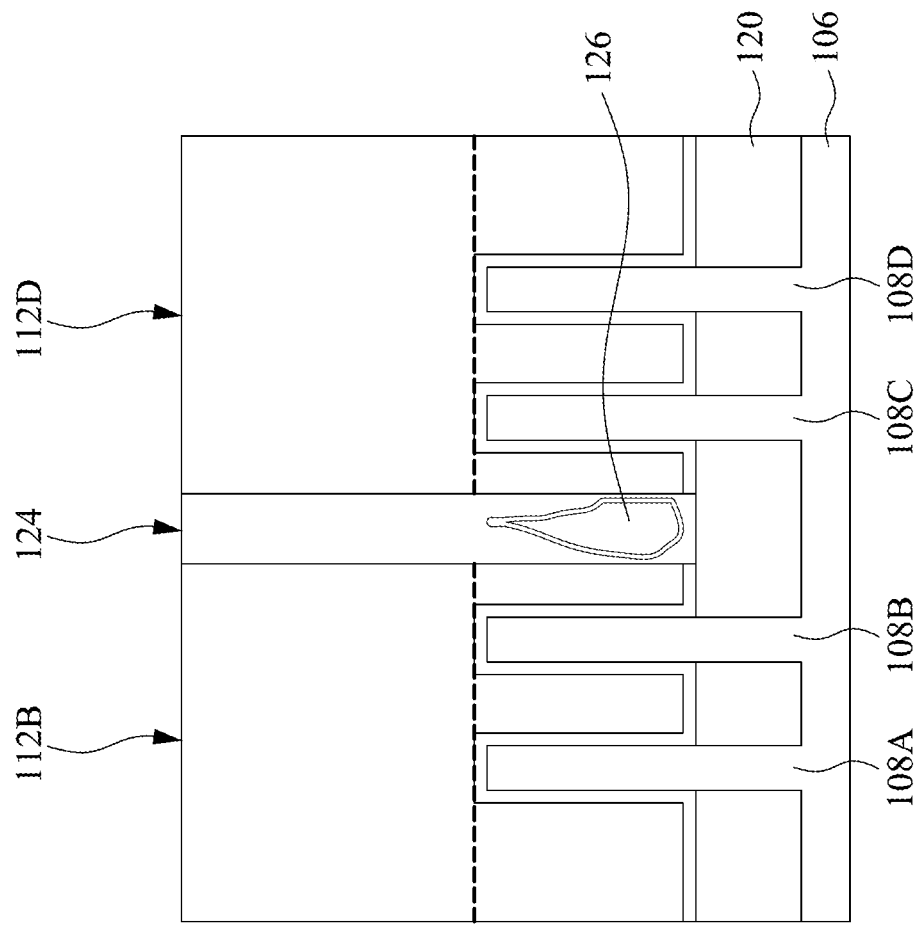

Referring to FIG. 3A-3C, fill structure 124 can be disposed on STI regions 120 and air gap 126 can be disposed above STI regions 120 and below top surfaces of fin structures 108. In some embodiments, as shown in FIG. 3A, air gap 126 can have an oval shape with a seam 128 above air gap 126. In some embodiments, as shown in FIG. 3B, air gap 126 can have an oval shape without a seam. In some embodiments, as shown in FIG. 3C, air gap 126 can have a triangular shape without a seam. In some embodiments, air gap 126 can have other shapes formed during the deposition of fill structure 124. In some embodiments, fill structure 124 can include a SiN-based dielectric material having a dielectric constant from about 6.5 to about 8 and air gap 126 can have a dielectric constant about 1. With a lower dielectric constant than the SiN-based dielectric material, air gap 126 can reduce the dielectric constant of fill structure 124 and reduce the parasitic capacitances in semiconductor device 100.

In some embodiments, a distance 126$t$ between air gap 126 and a bottom surface of fill structure 124 can range from about 0.1 nm to about 20 nm. If distance 126$t$ is less than about 0.1 nm, air gap 126 may not be formed in fill structure 124. If distance 126$t$ is greater than about 20 nm, air gap 126 may be closer to top surfaces of gate structures 112B and 112D and may be exposed during subsequent chemical mechanical planarization (CMP) processes and etch processes, thus damaging fill structure 124.

In some embodiments, air gap 126 can have a vertical dimension 126h (e.g., height) along a Z-axis ranging from about 5 nm to about 30 nm. A ratio of vertical dimension 126h to vertical dimension 124h can range from about 0.2 to about 0.5. If vertical dimension 126h is less than about 5 nm, or the ratio is less than about 0.2, the dielectric constant of fill structure 124 may not be reduced and the parasitic capacitances in semiconductor device 100 may not be reduced. If vertical dimension 126h is greater than about 30 nm, or the ratio is greater than about 0.5, fill structure 124 may be damaged during subsequent CMP processes and etch processes. In some embodiments, air gap 126 can have a horizontal dimension 126w (e.g., width) along a Y-axis ranging from about 5 nm to about 11 nm. A ratio of horizontal dimension 126w to horizontal dimension 124w can range from about 0.6 to about 1. If horizontal dimension 126w is less than about 5 nm, or the ratio is less than about 0.6, the dielectric constant of fill structure 124 may not be reduced and the parasitic capacitances in semiconductor device 100 may not be reduced. If horizontal dimension 126w is greater than about 11 nm, or the ratio is greater than about 1.0, air gap 126 may not be formed in fill structure 124.

In some embodiments, as shown in FIGS. 3A-3C, air gap 126 can be disposed below top surfaces of fin structures 108. A distance 126d along a Z-axis between air gap 126 and top surfaces of fin structures 108 can range from about 5 nm to about 50 nm. If distance 126d is less than about 5 nm, fill structure 124 may be damaged during subsequent CMP processes and etch processes. If distance 126d is greater than about 50 nm, air gap 126 may have a smaller dimension and the dielectric constant of fill structure 124 may not be reduced.

Figure 3D:
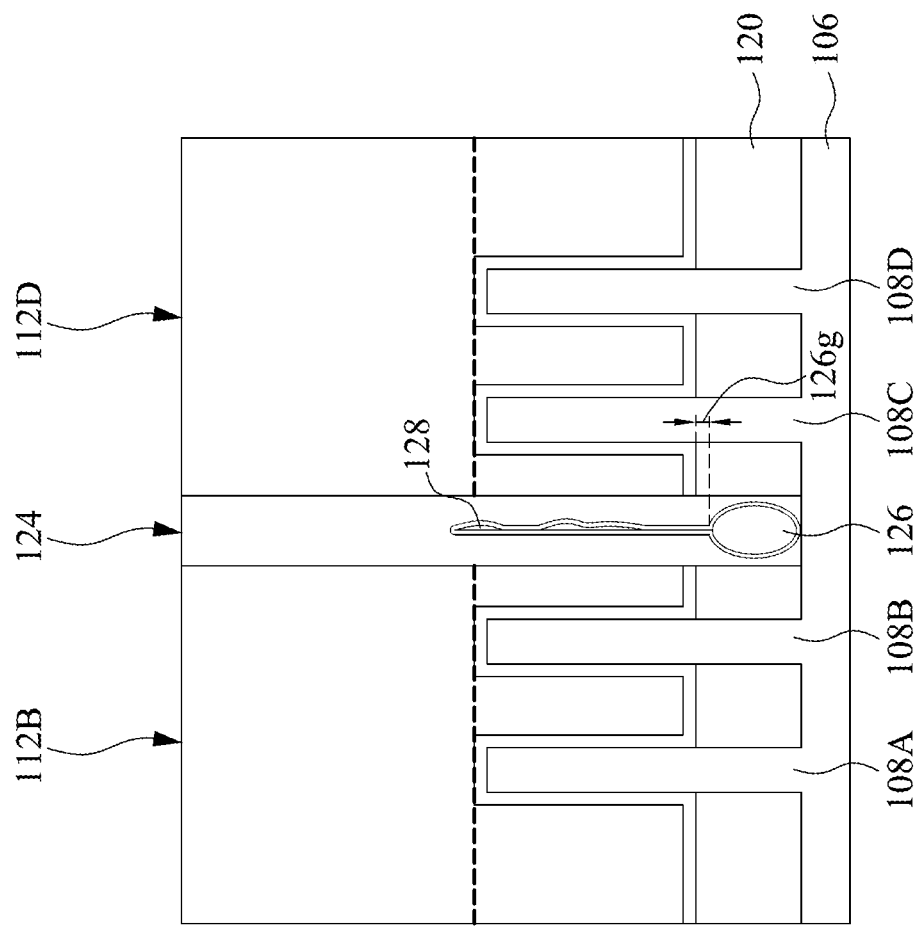

In some embodiments, as shown in FIG. 3D, fill structure 124 can be disposed on substrate 106 and air gap 126 can be disposed below a top surface of STI regions 120. A distance 126g along a Z-axis between air gap 126 and top surfaces of STI regions 120 can range from about 1 nm to about 5 nm. Referring to FIG. 3D, air gap 126 can be surrounded by STI regions 120 and can be further away from top surfaces of gate structures 112A-112D. Air gap 126 can reduce the dielectric constant of fill structure 124. As a result, the parasitic capacitance in semiconductor device 100 can be reduced and fill structure 124 may not be damaged during subsequent CMP processes and etch processes. In some embodiments, air gap 126 in FIG. 3D can extend above the top surface of STI regions 120 but below the top surfaces of fin structures 108, which can further reduce the dielectric constant of fill structure 124 and parasitic capacitances of semiconductor device 100.

Referring to FIGS. 2 and 3A, seam 128 can be disposed in upper portion 124-2 of fill structure 124. Seam 128 can be formed during the sealing of air gap 126 in fill structure 124. In some embodiments, seam 128 can have a width 128w along a Y-axis ranging from about 0.1 nm to about 5 nm. If width 128w is less than about 0.1 nm, the formation of fill structure 124 may take longer. If width 128w is greater than about 5 nm, fill structure 124 may be damaged during subsequent CMP processes and etch processes. In some embodiments, seam 128 can be minimal and fill structure 124 can include air gap 126 without a seam, as shown in FIGS. 3B and 3C.

Figure 4:
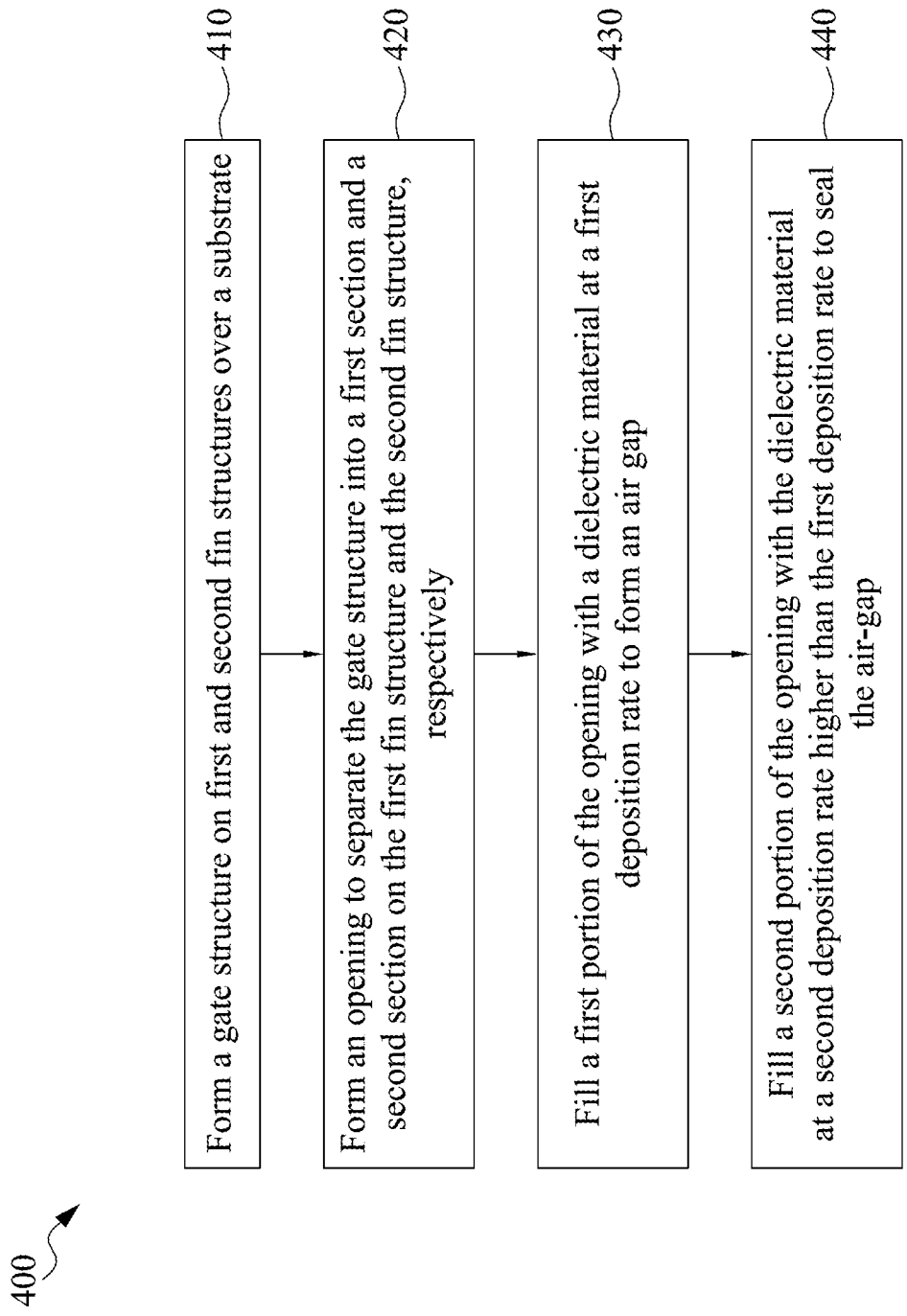
FIG. 4 is a flow diagram of a method for fabricating a semiconductor device with a fill structure, in accordance with some embodiments.

FIG. 4 is a flow diagram of a method 400 for fabricating semiconductor device 100 with fill structure 124, in accordance with some embodiments. Method 400 may not be limited to finFET devices and can be applicable to devices that would benefit from fill structures having air gaps, such as planar FETs, finFETs, gate-all-around (GAA) finFETs, and other semiconductor devices. Additional fabrication operations may be performed between various operations of method 400 and may be omitted merely for clarity and ease of description. Additional processes can be provided before, during, and/or after method 400; one or more of these additional processes are briefly described herein. Moreover, not all operations may be needed to perform the disclosure provided herein. Additionally, some of the operations may be performed simultaneously or in a different order than shown in FIG. 4. In some embodiments, one or more other operations may be performed in addition to or in place of the presently described operations.

Figure 5:
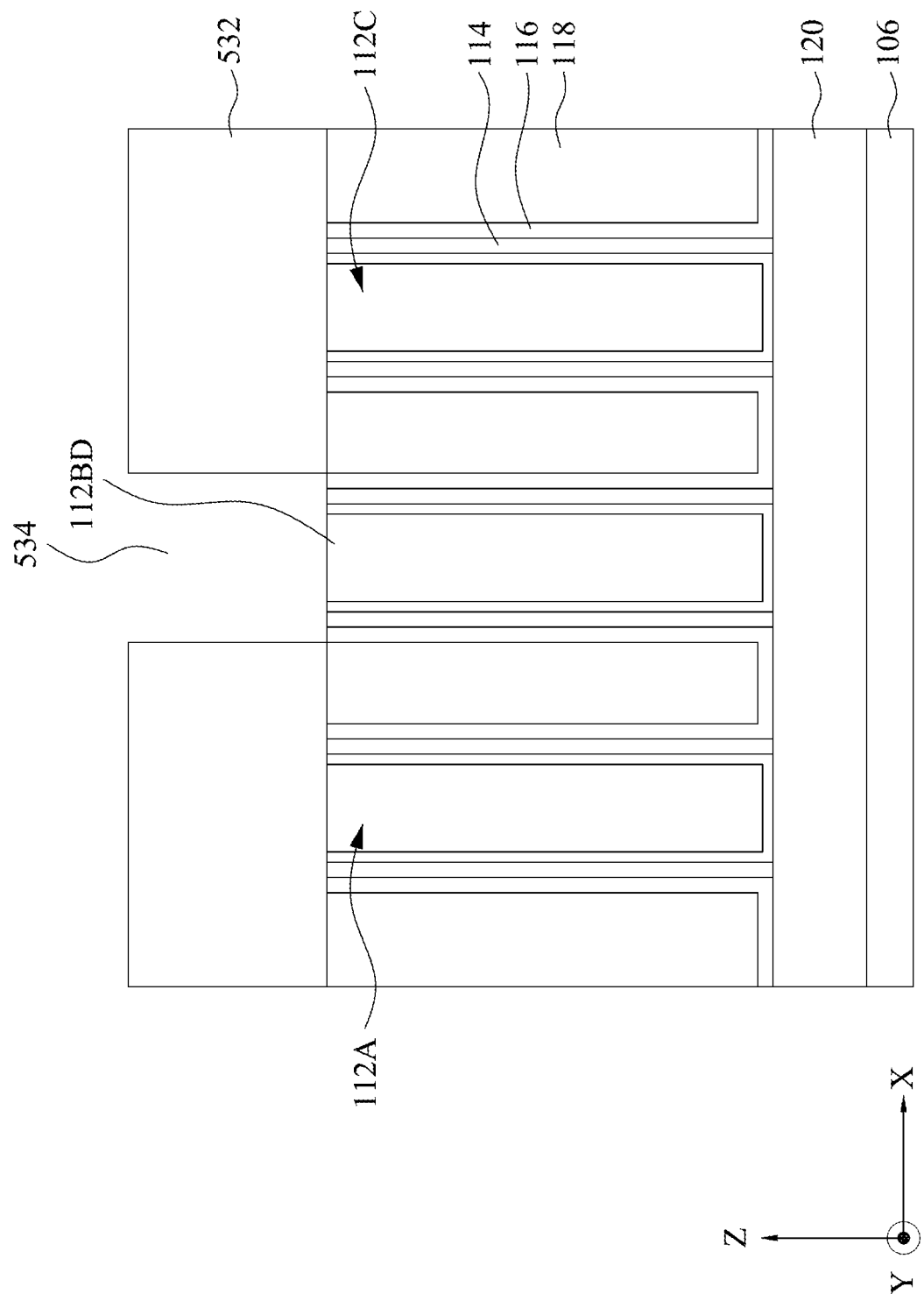
FIGS. 5-8, 12, and 13A-13D illustrate cross-sectional views of a semiconductor device with a fill structure at various stages of its fabrication, in accordance with some embodiments.
Figure 6:
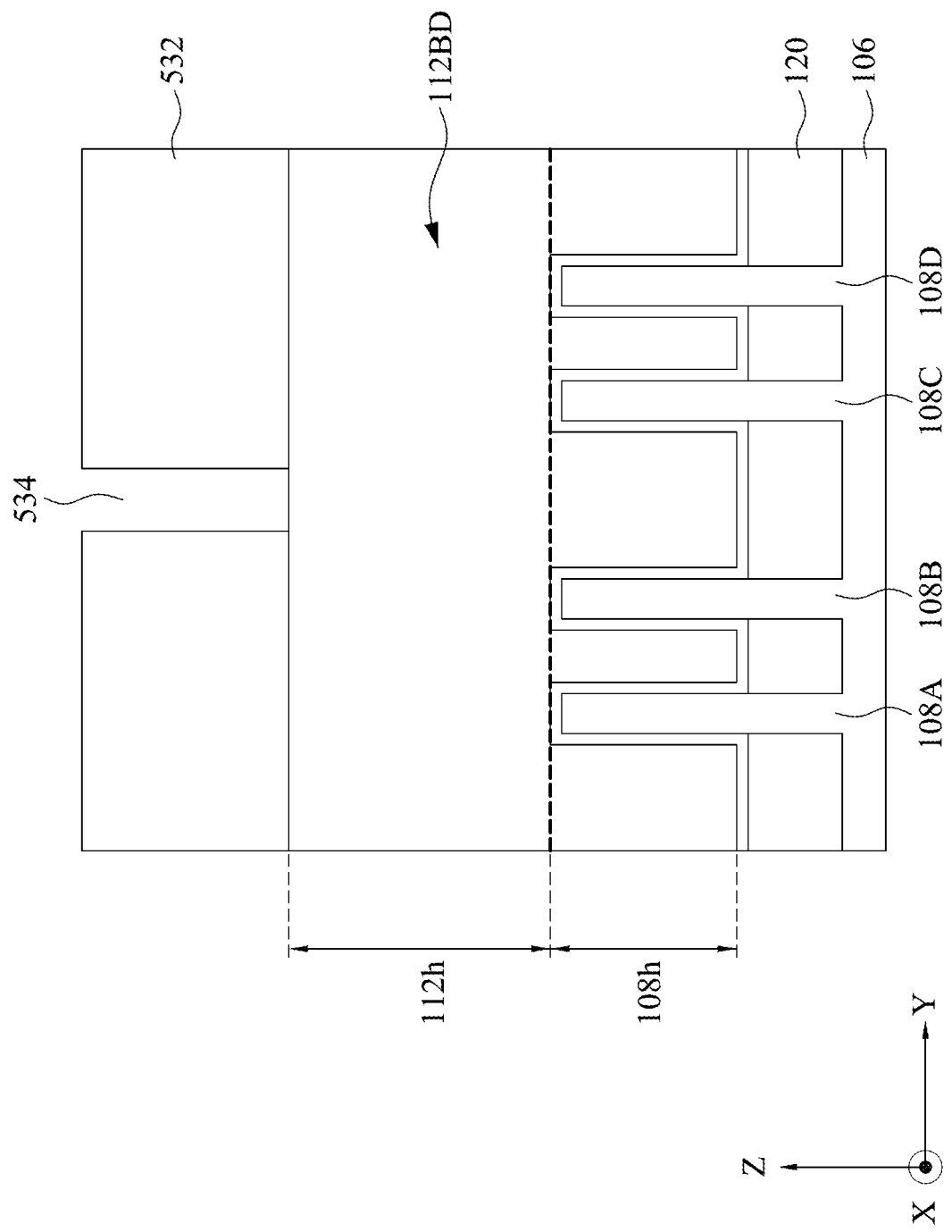
Figure 7:
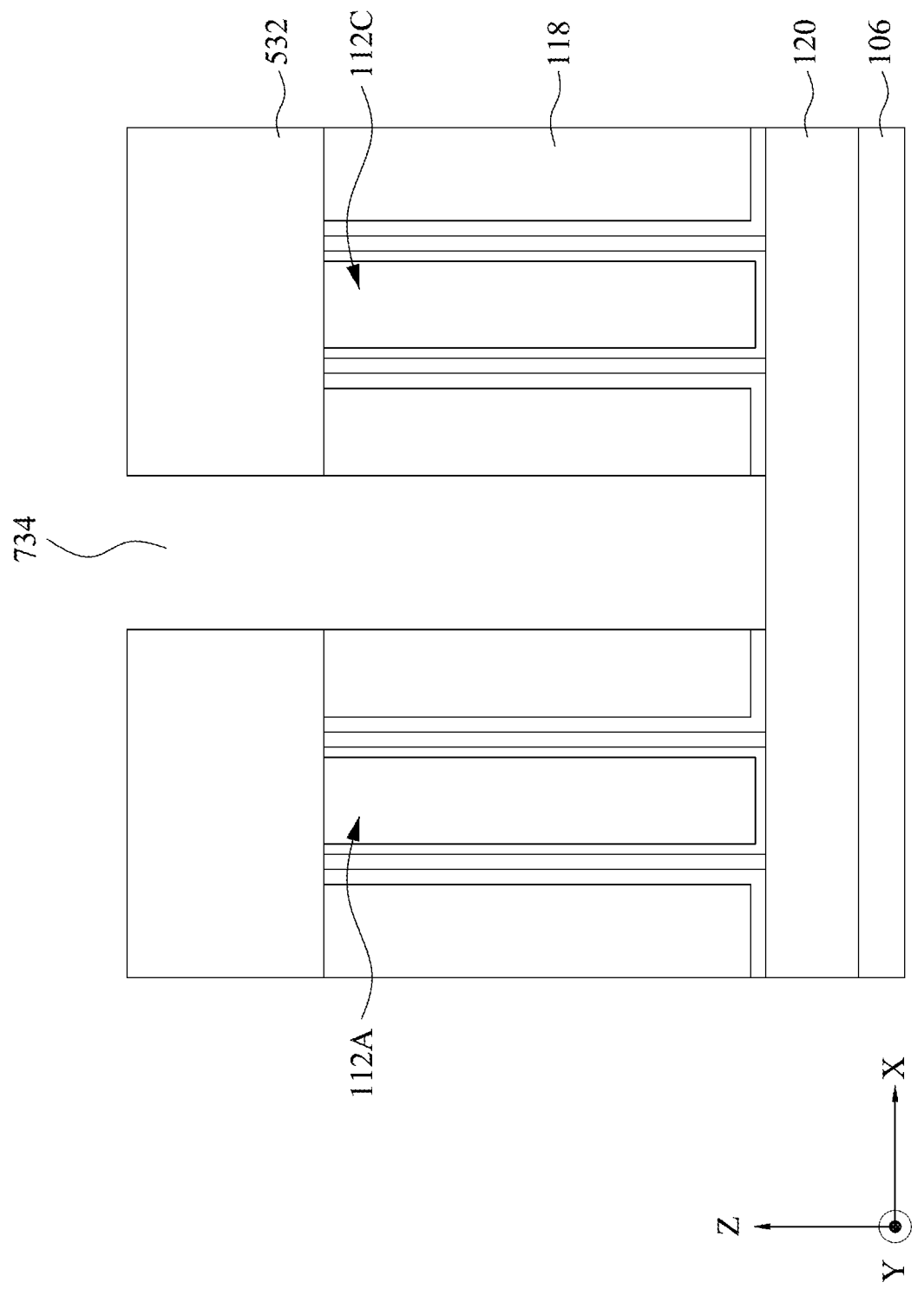
Figure 12:
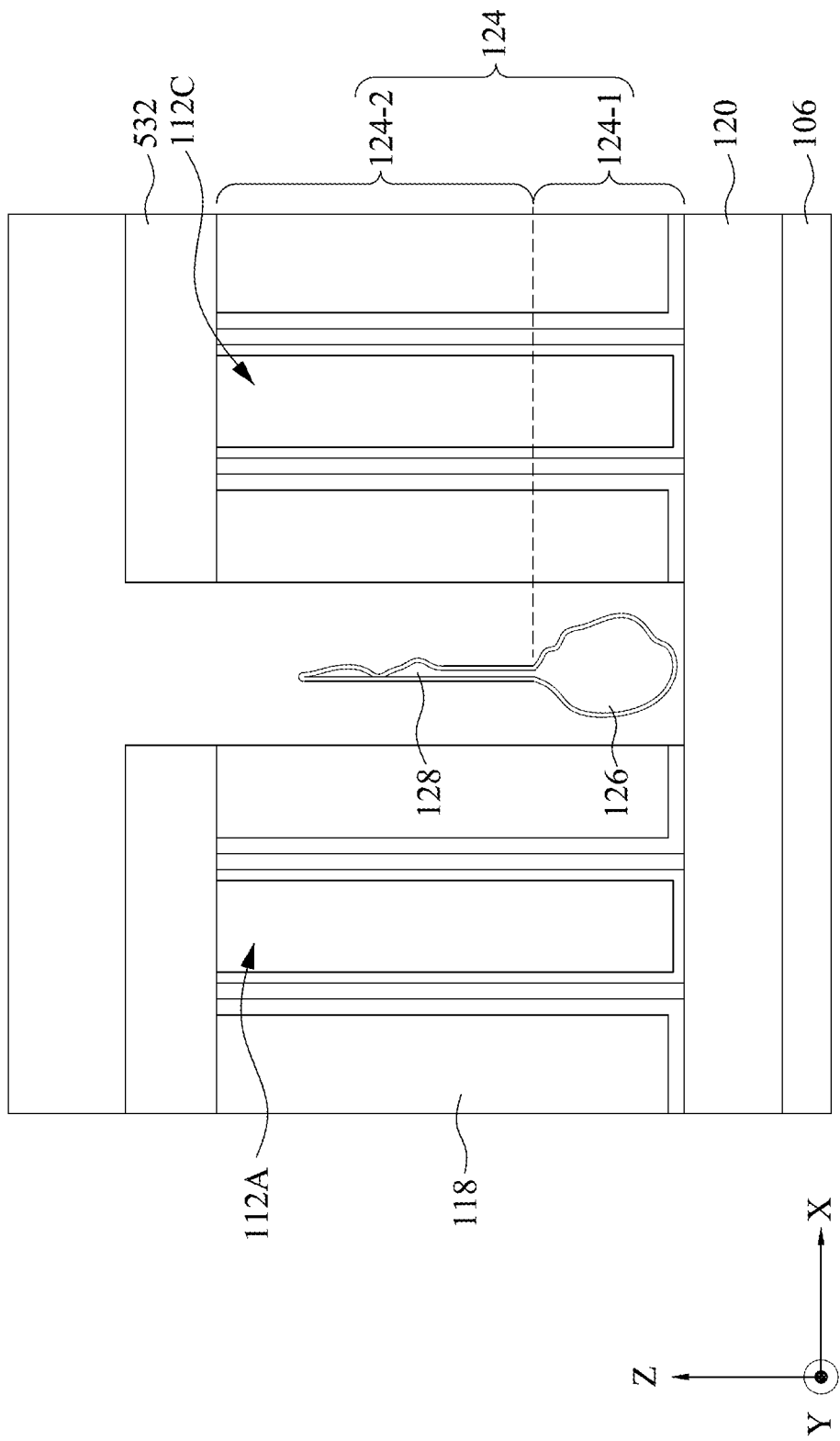

For illustrative purposes, the operations illustrated in FIG. 4 will be described with reference to the example fabrication process for fabricating semiconductor device 100 as illustrated in FIGS. 5-8, 12, and 13A-13D. These figures illustrate cross-sectional views of semiconductor device 100 with fill structure 124 at various stages of its fabrication, in accordance with some embodiments. FIGS. 5, 7, and 12 illustrate cross-sectional views of semiconductor device 100 along line A-A in FIG. 1. FIGS. 6, 8, and 13A-13D illustrate cross-sectional views of semiconductor device 100 along line B-B in FIG. 1. Elements in FIGS. 5-8, 12, and 13A-13D with the same annotations as elements in FIGS. 1, 2, and 3A-3D are described above.

In referring to FIG. 4, method 400 begins with operation 410 and the process of forming a gate structure on first and second fin structures over a substrate. For example, as shown in FIGS. 5 and 6, gate structures 112A, 112C, and 112BD can be formed on fin structures 108. Gate structures 112BD will be cut in subsequent processes by fill structure 124 to form gate structures 112B and 112D. The formation of gate structures 112A, 112C, and 112BD can include sequential operations of: (i) patterning substrate 106 to form fin structures 108, (ii) forming polysilicon gate structures (not shown) on portions of fin structures 108 that will have gate structures 112A, 112C, and 112BD formed in subsequent processes, (iii) etching back portions of fin structures 108 that are not covered by the polysilicon gate structures, (iv) forming S/D epitaxial structures 110 on the etched back fin structures 108, and (v) replacing the polysilicon gate structures with gate structures 112A, 112C, and 112BD. In some embodiments, gate structures 112A, 112C, and 112BD can have height 112h above the top surfaces of fin structures 108 ranging from about 40 nm to about 60 nm. In some embodiments, fin structures 108 can have height 108h above STI regions 120 along a Z-axis ranging from about 40 nm to about 60 nm.

Referring to FIG. 4, in operation 420, an opening is formed to separate the gate structure into a first section and a second section on the first fin structure and the second fin structure, respectively. For example, as shown in FIGS. 5-8, an opening 734 can be formed across gate structure 112BD to separate gate structure 112BD to gate structures 112B and 112D on fin structures 108A-108B and fin structures 108C-108D, respectively. The formation of opening 734 can include sequential operations of: (i) depositing and patterning hard mask layer 532 on the structures of FIGS. 5 and 6 to form an opening 534, and (ii) etching portions of gate structures 112BD and adjacent dielectric portions through opening 534. The adjacent dielectric portions includes portions of gate spacers 114, ESL 116, and ILD layer 118 on the sidewalls of gate structures 112BD.

In some embodiments, hard mask layer 532 can include a SiN layer deposited by chemical vapor deposition (CVD). Hard mask layer 532 can be patterned using a photolithography process followed by a dry etching process to form opening 534. The dry etching process can include using a gas mixture of fluoromethane ($CHF_3$), oxygen, and argon. Opening 534 can expose portions of gate structure 112BD and the adjacent dielectric portions that are removed in subsequent processes to form opening 734. According to some embodiments, hard mask layer 532 can protect the underlying structures during the subsequent etching process to form opening 734. Though opening 534 and 734 are shown to have straight sidewalls, opening 534 and 734 can have sloped sidewalls due to process variations.

Figure 8:
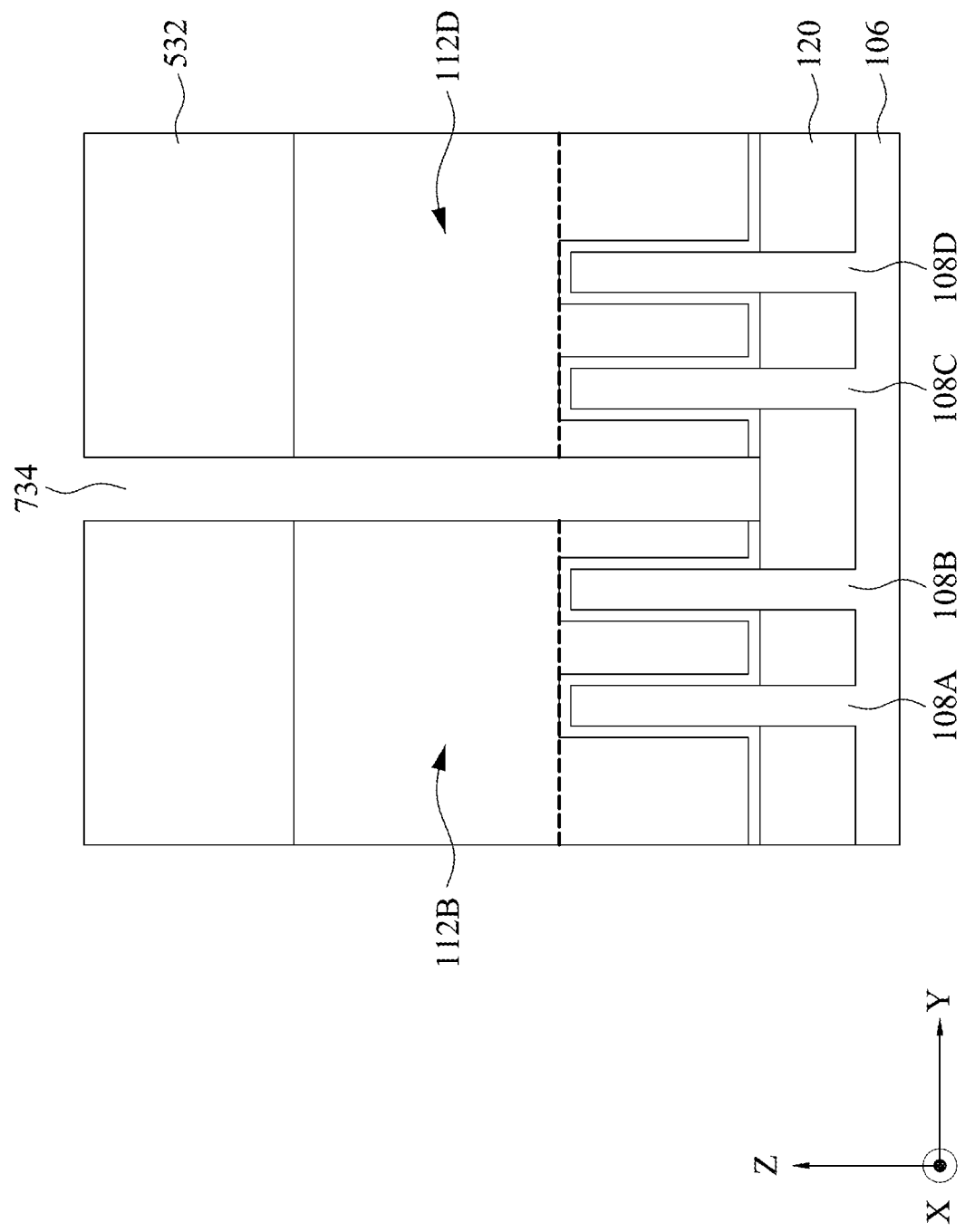
Figure 13A:
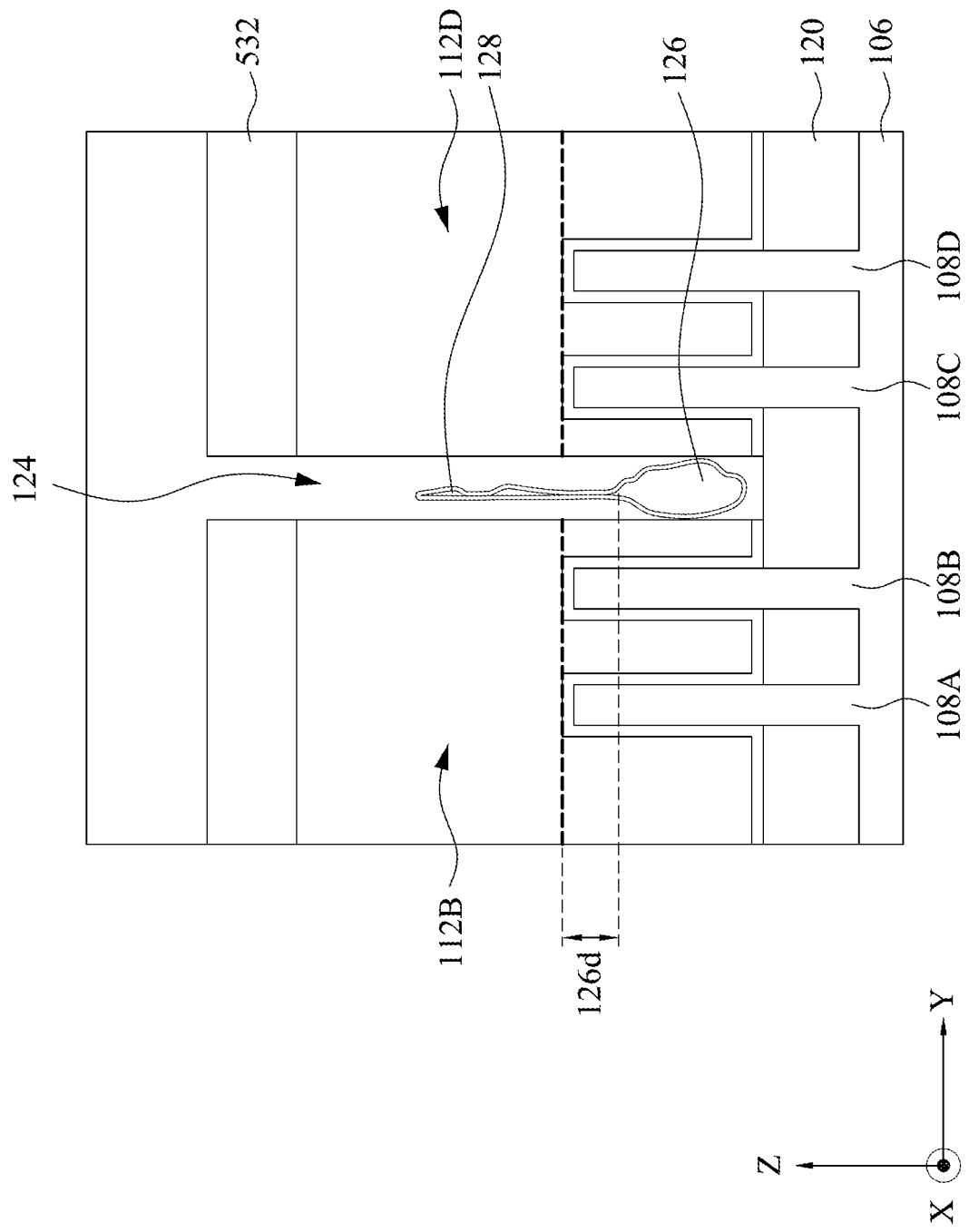
Figure 13B:
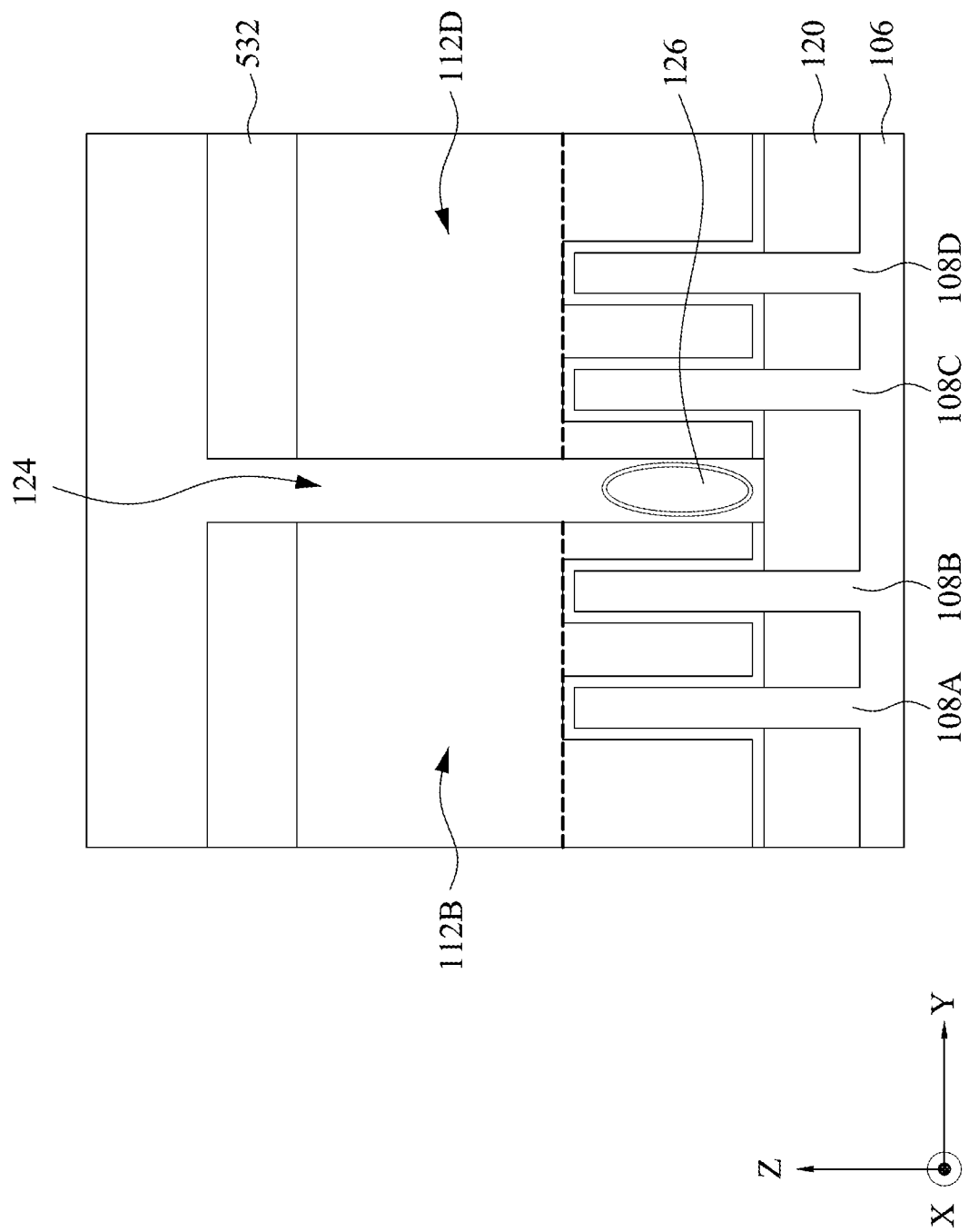
Figure 13C:
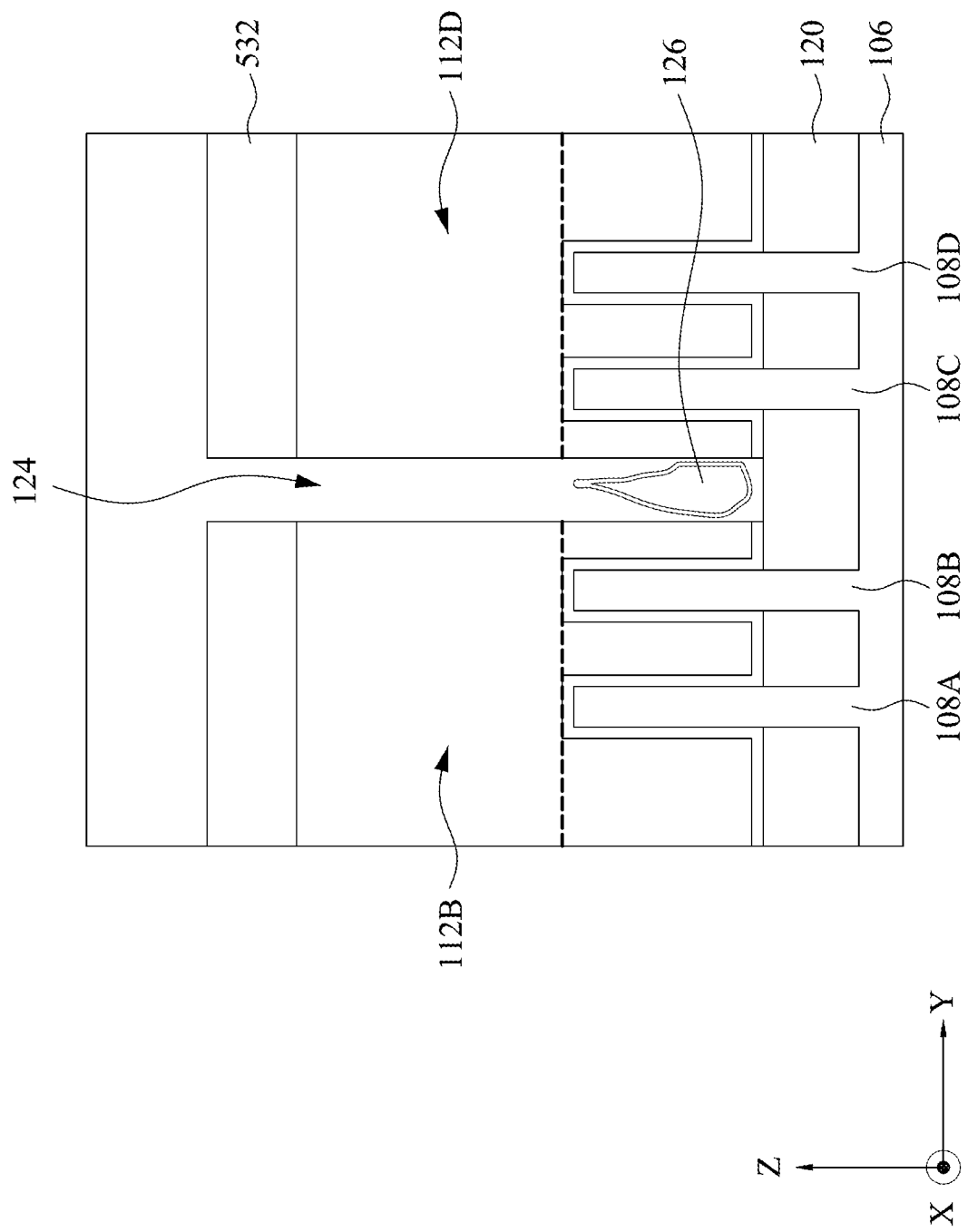
Figure 13D:
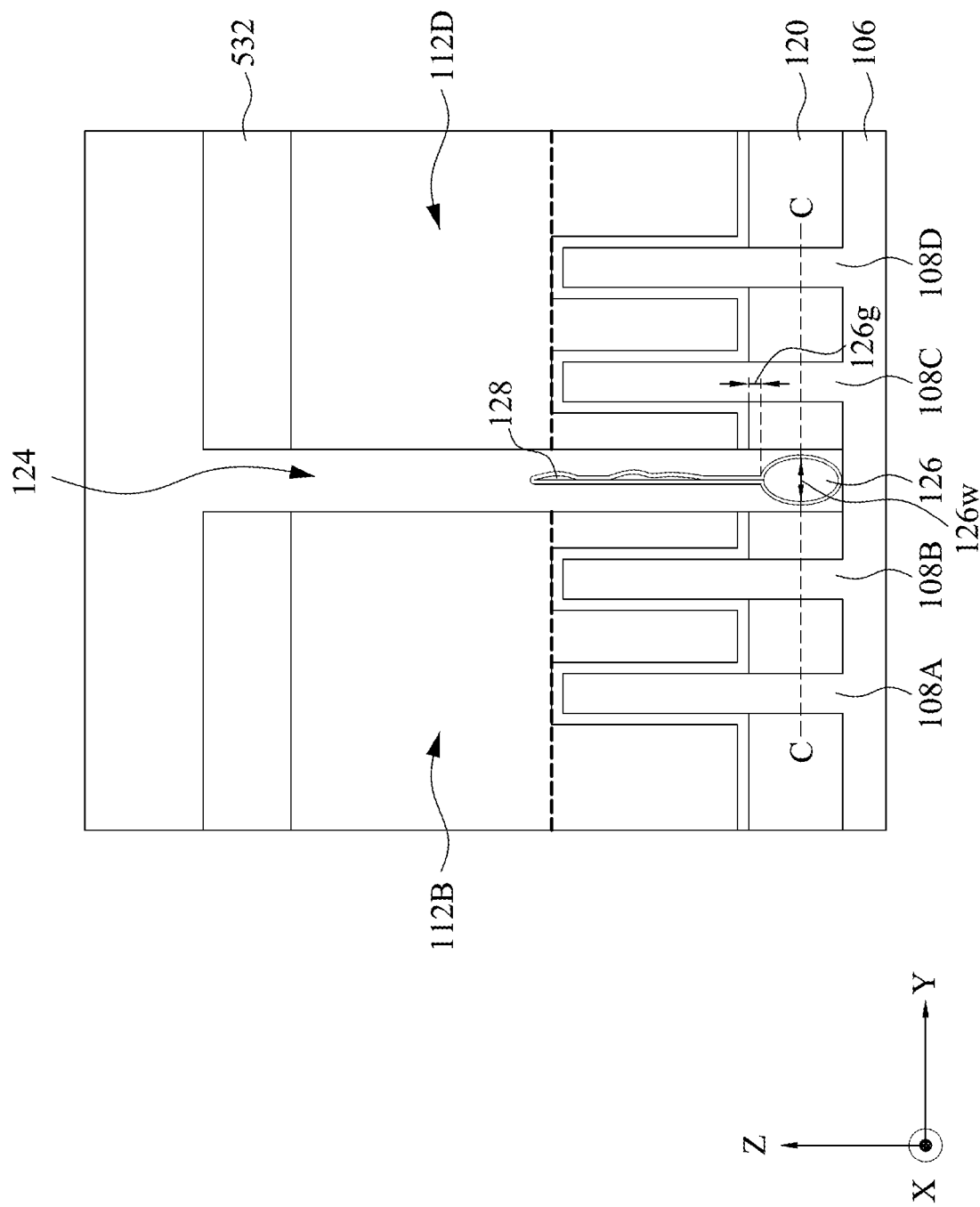

The etching process to remove the exposed structures through opening 534 can include a dry etching process. In some embodiments, the dry etching process can use etchants including a gas mixture of chlorine, methane ($CH_4$), boron chloride ($BCl_3$), and oxygen. The etching process can remove portions of gate structures 112BD and adjacent dielectric portions to form opening 734, as shown in FIGS. 7 and 8. In some embodiments, the etching process can stop on STI regions 120, as shown in FIGS. 7 and 8. In some embodiments, the etching process can stop on substrate 106, as shown in FIG. 13D. Opening 734 can cut gate structures 112BD into gate structures 112B and 112D, as shown in FIG. 8.

Referring to FIG. 4, in operation 430, a first portion of the opening is filled with a dielectric material at a first deposition rate to form an air gap. For example, as shown in FIGS. 12 and 13A, a lower portion of opening 734 can be filled with a dielectric material at a first deposition rate to form air gap 126 and lower portion 124-1 of fill structure 124. In some embodiments, the dielectric material can include SiN or other suitable dielectric materials. The dielectric material can be deposited by atomic layer deposition (ALD) or other suitable deposition methods. In some embodiments, the dielectric material can be deposited at a temperature from about 300° C. to about 600° C. under a pressure from about 10 torr to about 40 torr. The precursors of the deposition process can include a Si precursor, a nitrogen gas ($N_2$), and a hydrogen gas ($H_2$). In some embodiments, the Si precursor can include $SiH_2I_2$, where I can be fluorine (F), chlorine (Cl), or bromine (Br). In some embodiments, the Si precursor can have a melting point from about −5° C. to about 5° C. and a boiling point from about 55° C. to about 65° C.

The formation of lower portion 124-1 of fill structure 124 can include performing deposition loop 1 and deposition loop 2 in a deposition chamber, as shown in FIGS. 10A and 10B. In deposition loop 1, bottom and sidewall surfaces of opening 734 can be treated for subsequent deposition of the dielectric material, for which deposition loop 1 can also be referred to as an "incubation loop." Deposition loop 1 can include four operations of feed, purge 1, radio-frequency power (RF) on, and purge 2. Each operation can take about 2 s to about 6 s. During the feed operation, the Si precursor, $N_2$, and $H_2$ can be delivered to opening 734. In some embodiments, a flow rate of the Si precursor can range from about 5 standard cubic centimeter per minute (SCCM) to about 20 SCCM. A flow rate of $N_2$ can range from about 5 SCCM to about 20 SCCM. A flow rate of $H_2$ can range from about 5 SCCM to about 20 SCCM. During the purge operation, the Si precursor can stop and the deposition chamber can be purged with $N_2$ and $H_2$. During the RF on operation, a RF source can be turned on to ionize the Si precursor, $N_2$, and $H_2$ in opening 734. In some embodiments, a power of the RF source can range from about 600 W to about 1000 W. A plasma of the Si precursor, $N_2$, and $H_2$ can be formed to treat sidewall and bottom surfaces of opening 734. After the plasma treatment, $N_2$ and $H_2$ can purge the deposition chamber in the purge 2 operation. In some embodiments, deposition loop 1 of FIG. 10A can be performed for about 2 to 10 cycles to prepare sidewall and bottom surfaces of opening 734 for deposition of the dielectric material. As shown in FIG. 9A, an —NH bond can be formed on the sidewall and bottom surfaces of opening 734 for subsequent deposition of the dielectric material.

In deposition loop 2, the dielectric material can be deposited in the lower portion of opening 734 to form air gap 126 and lower portion 124-1 of fill structure 124, for which deposition loop 2 can also be referred to as a "bulk layer loop." As shown in FIG. 10B, deposition loop 2 can include four operations of feed, purge 1, RF on, and purge 2, similar to deposition loop 1. Deposition loop 2 can have no $H_2$ for these four operations, according to some embodiments. During the feed operation, the Si precursor and $N_2$ can be delivered to opening 734. In some embodiments, a flow rate of the Si precursor can range from about 5 SCCM to about 20 SCCM. A flow rate of $N_2$ can range from about 5 SCCM to about 20 SCCM. During the purge operation, the Si precursor can stop and the deposition chamber can be purged with $N_2$. During the RF on operation, the RF source can be turned on to ionize the Si precursor and $N_2$ in opening 734. In some embodiments, the power of the RF source can range from about 600 W to about 1000 W. A plasma 936 of the Si precursor and $N_2$ can be formed to deposit the dielectric material at a first deposition rate on sidewall and bottom surfaces of opening 734. As shown in FIGS. 9B and 9C, the Si precursor can bond with the —NH bond. The plasma 936 can treat the sidewall and bottom surfaces of opening 734 to form the dielectric material and prepare for further deposition of the dielectric material. After the plasma treatment, $N_2$ can purge the deposition chamber in the purge 2 operation. In some embodiments, deposition loop 2 of FIG. 10B can be performed for about 200 cycles to about 300 cycles to form air gap 126 and lower portion 124-1 of fill structure 124. Without $H_2$ in deposition loop 2 of FIG. 10B, the dielectric material can be deposited on sidewall and bottom surfaces of opening 734 without sealing air gap 126.

Referring to FIG. 4, in operation 440, a second portion of the opening is filled with the dielectric material at a second deposition rate higher than the first deposition rate to seal the air gap. For example, as shown in FIGS. 12 and 13A, a higher portion of opening 734 can be filled with the dielectric material at a second deposition rate higher than the first deposition rate to seal air gap 126 and form upper portion 124-2 of fill structure 124. In some embodiments, upper portion 124-2 of fill structure 124 can include the same dielectric material as lower portion 124-1 and formed by a deposition process similar to lower portion 124-1 under the same process conditions.

Figures 11A, 11B:
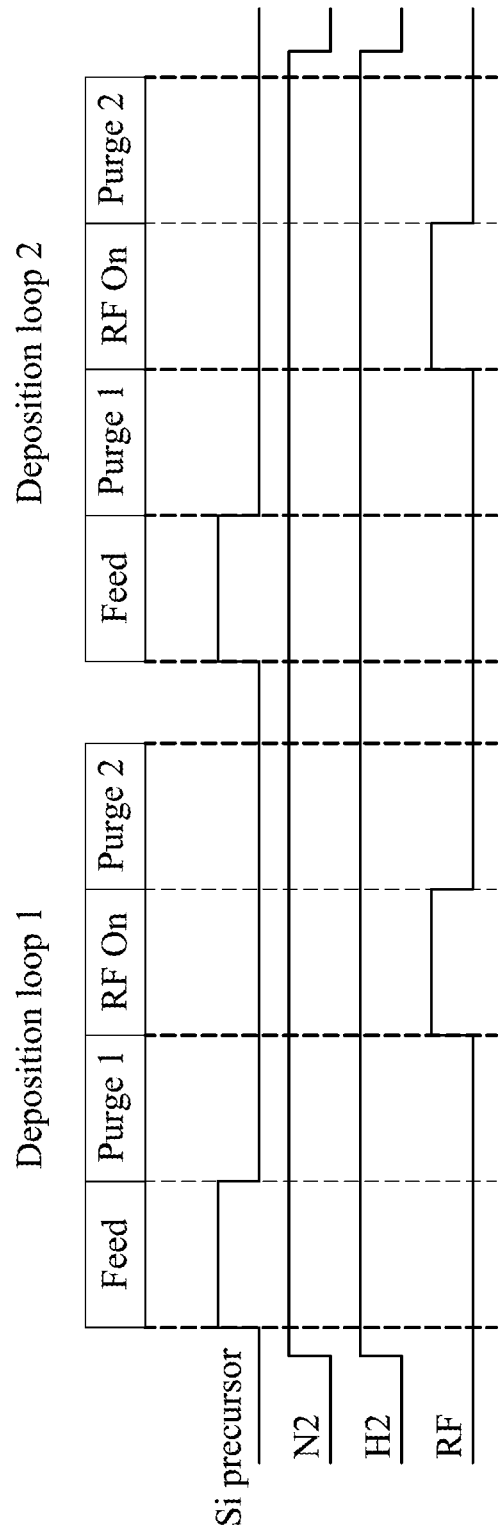

The formation of upper portion 124-2 of fill structure 124 can include performing deposition loop 1 and deposition loop 2 in the deposition chamber, as shown in FIGS. 11A and 11B. Deposition loop 1 of FIG. 11A for upper portion 124-2 can be the same as deposition loop 1 of FIG. 10A for lower portion 124-1. Bottom and sidewall surfaces of opening 734 can be treated for subsequent deposition of the dielectric material. Compared to deposition loop 2 of FIG. 10B for lower portion 124-1, in some embodiments, deposition loop 2 of FIG. 11B for upper portion 124-2 can have $H_2$ turned on for the four operations of feed, purge 1, radio-frequency power (RF) on, and purge 2. A flow rate of $H_2$ during deposition loop 2 of FIG. 11B can range from about 5 SCCM to about 20 SCCM. At the RF on operation during deposition loop 2 of FIG. 11B, a plasma 936 of the Si precursor, N$_2$ and H$_2$ can be formed to deposit the dielectric material at a second deposition rate on sidewall and bottom surfaces of opening 734, as shown in FIGS. 9B and 9C. With H$_2$ turned on, the second deposition rate can be higher than the first deposition to seal air gap 126.

In some embodiments, deposition loop 2 of FIG. 11B can be performed for about 200 cycles to about 300 cycles to seal air gap 126 and form upper portion 124-2 of fill structure 124. In some embodiments, a ratio of total cycles to form lower portion 124-1 to total cycles to form upper portion 124-2 can range from about 0.4 to about 0.6. In some embodiments, the total cycles to form lower portion 124-1 can be the same as the total cycles to form upper portion 124-2. In some embodiments, as shown in FIG. 13A, a seam 128 can be formed in upper portion 124-2 after the deposition of the dielectric material. Seam 128 can have a width 128w ranging from about 0.1 nm to about 5 nm. In some embodiments, width 128w of seam 128 can be random due to variations of the deposition process. In some embodiments, seam 128 can be minimal and fill structure 124 can include air gap 126 without a seam, as shown in FIGS. 13B and 13C.

The dielectric material in deposition loop 2 of FIG. 11B can seal air gap 126 and form upper portion 124-2 of fill structure 124. With H$_2$ in deposition loop 2 of FIG. 11B, the second deposition rate can be higher than the first deposition rate. In some embodiments, a ratio of the second deposition rate to the first deposition rate can range from about 2 to about 5. If the ratio is less than about 2, air gap 126 may not be sealed. If the ratio is greater than about 5, width 128w of seam 128 in upper portion 124-2 may be greater than about 5 nm. Fill structure 124 may be damaged during subsequent CMP processes and etch processes. In some embodiments, as shown in FIGS. 13A-13C, fill structure 124 can be formed on STI regions 120 to isolate gate structures 112B and 112D. Air gap 126 can be enclosed in lower portion 124-1 below top surfaces of fin structures 108. In some embodiments, as shown in FIG. 13D, fill structure 124 can extend into STI regions 120 and can be formed on substrate 106 to isolate gate structures 112B and 112D. Air gap 126 can be enclosed in low portion 124-1 below a top surface of STI regions 120. In some embodiments, distance 126g along a Z-axis between air gap 126 and top surfaces of STI regions 120 can range from about 1 nm to about 5 nm.

Figure 14:
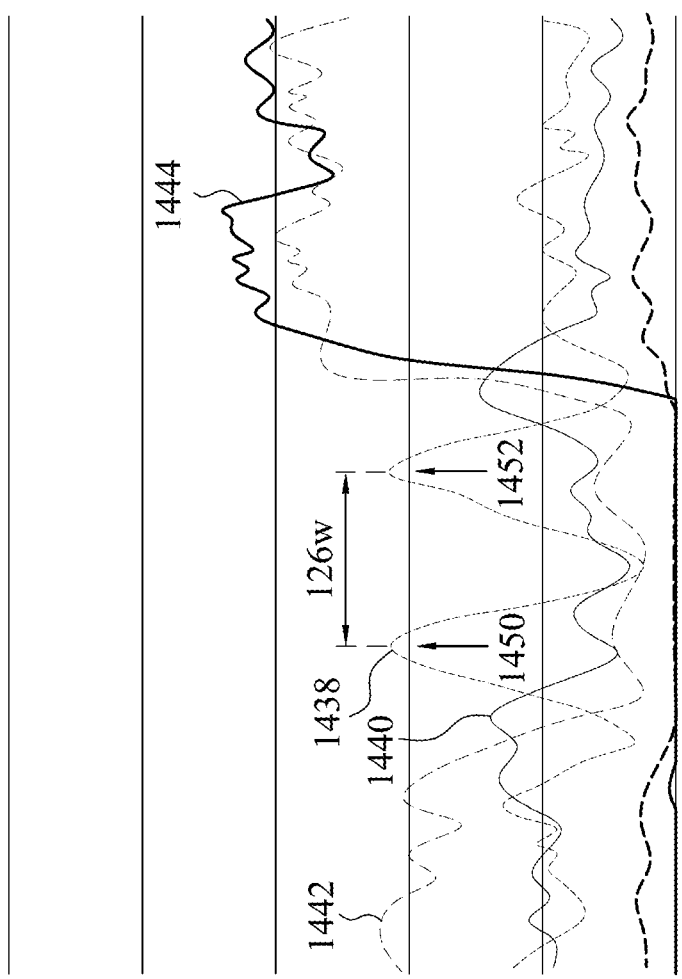
FIG. 14 illustrates element profiles of a semiconductor device with a fill structure, in accordance with some embodiments.

FIG. 14 can illustrate element profiles in semiconductor device 100 with fill structure 124 across line C-C in FIG. 13D, according to some embodiments. Referring to FIG. 14, profile 1438 can illustrate a nitrogen profile along line C-C in semiconductor device 100, profile 1440 can illustrate an oxygen profile along line C-C in semiconductor device 100, profile 1442 can illustrate a hafnium profile along line C-C in semiconductor device 100, and profile 1444 can illustrate a tungsten profile along line C-C in semiconductor device 100. As shown in FIG. 14, areas between two nitrogen peaks 1450 and 1452 in nitrogen profile 1438 can indicate air gap 126 in FIG. 13D. A distance between two nitrogen peaks 1450 and 1452 can correspond to horizontal dimension 126w of air gap 126.

With air gap 126, the dielectric constant of fill structure 124 can be reduced compared to a fill structure without an air gap. In some embodiments, air gap 126 in fill structure 124 can reduce the dielectric constant of fill structure 124 by about 20% to about 50% compared to fill structures with only SiN-based dielectric materials. In addition, air gap 126 can be in lower portion 124-1 of fill structure 124 and below top surfaces of fin structures 108. Seam 128 can be below top surfaces of gate structures 112A-112D and width 128w of seam 128 can range from about 0.1 nm to about 5 nm. The configurations of the air gap and the seam can prevent etch back of the fill structure and prevent damage of the fill structure in subsequent processes. The deposition of the dielectric material in opening 734 can be followed by a CMP process to coplanarize top surfaces of gate structures 112A-112D, fill structure 124, and ILD layer 118, as shown in FIGS. 1, 2, and 3A-3D.

Various embodiments in the present disclosure provide example fill structure 124 having air gap 126 for reducing parasitic capacitance in semiconductor device 100 and example methods for fabricating the same. In some embodiments, fill structure 124 can include air gap 126, which has a dielectric constant of about 1, in lower portion 124-1 of fill structure 124 to reduce the dielectric constant of fill structure 124. In some embodiments, fill structure 124 can be formed on STI regions 120, as shown in FIGS. 3A-3C. Air gap 126 can be above STI regions 120 and below top surfaces of fin structures 108 of semiconductor device 100. In some embodiments, fill structure 124 can extend into STI regions 120 and air gap 126 can be formed below a top surface of STI regions 120. Fill structure 124 can be formed by depositing a SiN-based dielectric material at a first deposition rate to form air gap 126 at lower portion 124-1 of fill structure 124, followed by depositing the SiN-based dielectric material at a second deposition rate higher than the first deposition to seal air gap 126 and fill opening 734. In some embodiments, fill structure 124 can have seam 128 above air gap 126 and below top surfaces of gate structures 112A-112D. Air gap 126 in fill structure 124 can reduce the dielectric constant of fill structure 124 by about 20% to about 50% compared to fill structures with only SiN-based dielectric materials. In addition, the configurations of air gap 126 and seam 128 can prevent etch back of fill structure 124 and prevent damage of fill structure 124 in subsequent processes.

In some embodiments, a semiconductor structure includes first and second fin structures on a substrate, an isolation region on the substrate and between the first and second fin structures, a first gate structure disposed on the first fin structure and the isolation region, a second gate structure disposed on the second fin structure and the isolation region, and a fill structure on the isolation region and between the first and second gate structures. The fill structure includes a dielectric structure between the first and second gate structures and an air gap enclosed by the dielectric structure. The air gap is below top surfaces of the first and second fin structures.

In some embodiments, a semiconductor structure includes an isolation region on a substrate, first and second gate structures disposed on the isolation region, a fill structure on the substrate and between the first and second gate structures, and an interlayer dielectric structure on the isolation region and surrounding the first gate structure, the second gate structure, and the fill structure. The fill structure includes a dielectric structure in contact with the first and second gate structures and an air gap below a top surface of the isolation region.

In some embodiments, a method includes forming a gate structure on first and second fin structures over a substrate, forming an opening to separate the gate structure into a first section and a second section on the first fin structure and the second fin structure, respectively, and filling a second portion of the opening with the dielectric material at a second deposition rate higher than the first deposition rate to seal the air gap. The first section is on the first fin structure and the second section is on the second fin structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate structure on first and second fin structures;
   forming an opening to separate the gate structure into a first section on the first fin structure and a second section on the second fin structure;
   filling a first portion of the opening with a dielectric material at a first deposition rate to form an air gap; and
   filling a second portion of the opening with the dielectric material at a second deposition rate higher than the first deposition rate to seal the air gap.

2. The method of claim 1, wherein a ratio of the second deposition rate to the first deposition rate ranges from about 2 to about 5.

3. The method of claim 1, wherein filling the second portion of the opening with the dielectric material comprises forming the air gap above a bottom surface of the gate structure.

4. The method of claim 1, wherein filling the second portion of the opening with the dielectric material comprises forming the air gap below top surfaces of the first and second fin structures.

5. The method of claim 1, wherein filling the first portion of the opening with the dielectric material comprises:
   treating bottom and sidewall surfaces of the opening with a first plasma of a nitrogen gas and a hydrogen gas; and
   depositing the dielectric material in the opening with a second plasma of the nitrogen gas.

6. The method of claim 1, wherein filling the second portion of the opening with the dielectric material comprises:
   treating bottom and sidewall surfaces of the opening with a first plasma of a nitrogen gas and a hydrogen gas; and
   depositing the dielectric material in the opening with a second plasma of the nitrogen gas and the hydrogen gas.

7. The method of claim 1, wherein filling the second portion of the opening with the dielectric material comprises forming a seam in the second portion of the opening above the air gap and below a top surface of the gate structure.

8. A method, comprising:
   forming first and second fin structures on a substrate;
   forming an isolation region on the substrate and between the first and second fin structures;
   forming a gate structure on the isolation region and between the first and second fin structures;
   forming an opening in the gate structure to separate the gate structure into a first section on the first fin structure and a second section on the second fin structure;
   depositing a dielectric material at a first deposition rate to fill a first portion of the opening; and
   depositing the dielectric material in a second portion of the opening at a second deposition rate higher than the first deposition rate to form an air gap in the dielectric material.

9. The method of claim 8, wherein a ratio of the second deposition rate to the first deposition rate ranges from about 2 to about 5.

10. The method of claim 8, wherein depositing the dielectric material in the second portion of the opening comprises forming the air gap above a top surface of the isolation region.

11. The method of claim 8, wherein depositing the dielectric material in the second portion of the opening comprises forming the air gap below top surfaces of the first and second fin structures.

12. The method of claim 8, wherein depositing the dielectric material at the first deposition rate comprises:
    treating bottom and sidewall surfaces of the opening with a first plasma of a nitrogen gas and a hydrogen gas; and
    depositing the dielectric material in the opening with a second plasma of the nitrogen gas.

13. The method of claim 8, wherein depositing the dielectric material in the second portion of the opening comprises:
    treating bottom and sidewall surfaces of the opening with a first plasma of a nitrogen gas and a hydrogen gas; and
    depositing the dielectric material in the opening with a second plasma of the nitrogen gas and the hydrogen gas.

14. The method of claim 8, wherein depositing the dielectric material in the second portion of the opening comprises forming a seam in the dielectric material above the air gap and below a top surface of the gate structure.

15. A method, comprising:
    forming first and second fin structures on a substrate;
    forming a gate structure on the first and second fin structures;
    forming a gate spacer on sidewalls of the gate structure;
    forming an interlayer dielectric structure on the substrate and surrounding the gate structure, wherein the interlayer dielectric structure comprises a first dielectric material;
    etching a portion of the gate structure, the gate spacer, and the interlayer dielectric structure to form an opening separating the gate structure into first and second portions; and
    depositing, in the opening, a second dielectric material different from the first dielectric material to form a fill structure, wherein the fill structure comprises:
        a dielectric structure in contact with the gate spacer, the interlayer dielectric structure, and the first and second portions of the gate structure; and
        an air gap below top surfaces of the first and second fin structures.

16. The method of claim 15, wherein depositing the second dielectric material comprises:
    depositing the second dielectric material at a first deposition rate to fill a first portion of the opening; and
    depositing the second dielectric material in a second portion of the opening at a second deposition rate higher than the first deposition rate.

17. The method of claim 16, wherein a ratio of the second deposition rate to the first deposition rate ranges from about 2 to about 5.

18. The method of claim 16, wherein depositing the second dielectric material at the first deposition rate to fill the first portion of the opening comprises:
- treating bottom and sidewall surfaces of the opening with a first plasma of a nitrogen gas and a hydrogen gas; and
- depositing the second dielectric material in the opening with a second plasma of the nitrogen gas.

19. The method of claim 16, wherein depositing the dielectric material in the second portion of the opening at the second deposition rate comprises:
- treating bottom and sidewall surfaces of the opening with a first plasma of a nitrogen gas and a hydrogen gas; and
- depositing the second dielectric material in the opening with a second plasma of the nitrogen gas and the hydrogen gas.

20. The method of claim 15, wherein depositing the second dielectric material comprises forming a seam in the fill structure above the air gap and below a top surface of the gate structure.

\* \* \* \* \*

UNITED STATES PATENT AND TRADEMARK OFFICE
CERTIFICATE OF CORRECTION

| | | |
|---|---|---|
| PATENT NO. | : 12,324,199 B2 | Page 1 of 1 |
| APPLICATION NO. | : 18/595033 | |
| DATED | : June 3, 2025 | |
| INVENTOR(S) | : Lin et al. | |

It is certified that error appears in the above-identified patent and that said Letters Patent is hereby corrected as shown below:

In the Specification

In Column 9, Line 6, delete "($CHF_3$)," and insert -- ($CH_3F$), --, therefor.

Signed and Sealed this
Twenty-first Day of October, 2025

John A. Squires
*Director of the United States Patent and Trademark Office*